(12) United States Patent
Wang

(10) Patent No.: US 9,768,730 B2
(45) Date of Patent: Sep. 19, 2017

(54) AMPLIFICATION OF A RADIO FREQUENCY SIGNAL

(71) Applicant: Nokia Technologies Oy, Espoo (FI)

(72) Inventor: Zhancang Wang, Beijing (CN)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 14/894,479

(22) PCT Filed: May 29, 2013

(86) PCT No.: PCT/CN2013/076399
§ 371 (c)(1),
(2) Date: Nov. 27, 2015

(87) PCT Pub. No.: WO2014/190505
PCT Pub. Date: Dec. 4, 2014

(65) Prior Publication Data
US 2016/0118941 A1    Apr. 28, 2016

(51) Int. Cl.
*H03G 3/20* (2006.01)
*H03F 3/04* (2006.01)
(Continued)

(52) U.S. Cl.
CPC ......... *H03F 1/0205* (2013.01); *H03F 1/0222* (2013.01); *H03F 3/21* (2013.01);
(Continued)

(58) Field of Classification Search
CPC .................................. H03G 3/20; H03F 3/04
(Continued)

(56) References Cited

U.S. PATENT DOCUMENTS 5,936,464 A * 8/1999 Grondahl ............. H03F 1/0222
330/10
6,256,482 B1 * 7/2001 Raab ..................... H03F 1/0227
330/199
(Continued)

FOREIGN PATENT DOCUMENTS

CN         1384602 A    12/2002
CN       101106358 A     1/2008
(Continued)

OTHER PUBLICATIONS

Kimball, D. et al., "50% PAE WCDMA Basestation Amplifier Implemented with GaN HFETs", CSIC 2005 Digest, pp. 89-92.
(Continued)

*Primary Examiner* — Patricia T Nguyen
(74) *Attorney, Agent, or Firm* — Locke Lord LLP

(57) ABSTRACT

Apparatus (1) comprises envelope signal amplification circuitry (11) configured to receive an input envelope signal (ENV_in) indicative of an envelope of an input radio frequency signal (RF_in) and to output an amplified envelope signal (ENV_amp); and a radio frequency power amplifier (12) configured to receive a radio frequency control signal which is dependent on the input radio frequency signal(RF_in) and the input envelope signal (ENV_in), using the amplified envelope signal (ENV_amp) as its supply voltage, to output an amplified radio frequency signal (RF_amp). A method for amplification the radio frequency signal is also provided.

19 Claims, 10 Drawing Sheets

(51) Int. Cl.

| | |
|---|---|
| *H03F 1/02* | (2006.01) |
| *H03F 3/21* | (2006.01) |
| *H02M 3/158* | (2006.01) |
| *H02M 1/00* | (2006.01) |
| *H03F 3/193* | (2006.01) |
| *H03F 1/32* | (2006.01) |
| *H03F 3/195* | (2006.01) |

(52) U.S. Cl.
CPC .. *H02M 3/1584* (2013.01); *H02M 2001/0045* (2013.01); *H03F 1/3247* (2013.01); *H03F 3/193* (2013.01); *H03F 3/195* (2013.01); *H03F 2200/102* (2013.01); *H03F 2200/129* (2013.01); *H03F 2200/18* (2013.01); *H03F 2200/216* (2013.01); *H03F 2200/225* (2013.01); *H03F 2200/336* (2013.01); *H03F 2200/391* (2013.01); *H03F 2200/42* (2013.01); *H03F 2200/451* (2013.01); *H03F 2200/504* (2013.01); *H03F 2200/534* (2013.01); *H03F 2200/75* (2013.01)

(58) Field of Classification Search
USPC .......................................... 330/136, 297, 127
See application file for complete search history.

(56) References Cited

U.S. PATENT DOCUMENTS

| 6,646,501 | B1* | 11/2003 | Wessel | H03F 1/3247 |
| | | | | 330/10 |
| 7,333,778 | B2* | 2/2008 | Pehlke | H03C 1/06 |
| | | | | 330/10 |
| 2008/0024214 | A1* | 1/2008 | Kim | H03C 1/36 |
| | | | | 330/136 |
| 2008/0068078 | A1* | 3/2008 | Iwasaki | H03F 1/0261 |
| | | | | 330/124 R |
| 2011/0074467 | A1 | 3/2011 | Tang | |
| 2011/0191606 | A1 | 8/2011 | Hou et al. | |
| 2012/0269240 | A1 | 10/2012 | Balteanu et al. | |
| 2013/0135045 | A1* | 5/2013 | Khlat | H03G 1/04 |
| | | | | 330/127 |
| 2014/0111279 | A1* | 4/2014 | Brobston | H03F 1/0222 |
| | | | | 330/286 |
| 2015/0249432 | A1* | 9/2015 | Farahani Samani | H03F 1/0211 |
| | | | | 330/291 |

FOREIGN PATENT DOCUMENTS

| CN | 101247153 A | 8/2008 |
| CN | 101505178 A | 8/2009 |
| CN | 102035480 A | 4/2011 |
| WO | WO2012082632 | 6/2012 |

OTHER PUBLICATIONS

International Preliminary Report on Patentability for Int'l App. No. PCT/CN2013/076399, Dated: Dec. 1, 2015, 10 pages.
"Nujira—Pushing the envelope of power amplifier efficiency", Copyright 2012, http://www.nujira.com/technology-pa-746.php, Downloaded Jun. 21, 2013, 2 pages.
"Quantance—Ultra-fast 4G/LTE envelope tracking technology enables higher peak power and maximizes PA efficiency", Copyright 2011, http://quantance.com/technology, Downloaded Jun. 21, 2013, 1 page.
PCT International Search Report of International App. No. PCT/CN2013/076399, Mailing Date: Mar. 13, 2014, 5 pages.
PCT Written Opinion of the International Searching Authority of International App. No. PCT/CN2013/076399, Mailing Date: Mar. 13, 2014, 9 pages.
English Language Machine Translation of Chinese Patent Application Publication No. CN102035480A, 13 pages.
English Language Machine Translation of Chinese Patent Application Publication No. CN1384602A, 6 pages.
English Language Machine Translation of Chinese Patent Application Publication No. CN101106358A, 7 pages.
English Language Machine Translation of Chinese Patent Application Publication No. CN101505178A, 6 pages.
English Language Machine Translation of Chinese Patent Application Publication No. CN101247153A, 6 pages.
Kimball, D. et al., "High-Efficiency Envelope-Tracking W-CDMA Base-Station Amplifier Using GaN HFETs", IEEE Transactions on Microwave Theory and Techniques, vol. 54, No. 11, Nov. 2006, pp. 3848-3856.
Extended European Search Report for European Patent Application No. 13886093.7, Dated Nov. 3, 2016, 16 pages.
Sahu, B. et al., "A High Efficiency WCDMA RF Power Amplifier With Adaptive, Dual-Mode Buck-Boost Supply and Bias-Current Control", IEEE Microwave and Wireless Components Letters, vol. 17, No. 3, Mar. 2007, pp. 238-240.
Kheirkhahi, A. et al., "RF Power Amplifier Efficiency Enhancement by Envelope Injection and Termination for Mobile Terminal Applications", IEEE Transactions on Microwave Theory and Techniques, vol. 61, No. 2, Feb. 2013, pp. 878-889.
Kheirkhahi, A. et al., "Enhanced Class-A/AB Mobile Terminal Power Amplifier Efficiency by Input Envelope Injection and 'Self' Envelope Tracking", IEEE Microwave Symposium Digest, 2011, 4 pages.

* cited by examiner

AMPLIFICATION OF A RADIO FREQUENCY SIGNAL

FIELD

This application relates to amplification of a radio frequency signal.

BACKGROUND

Power amplifiers are often used to boost, or amplify, the power of a radio frequency (RF) signal having a relatively low power. Thereafter, the amplified RF signal can be used for a variety of purposes, including driving the antenna of a RF transmitter. As such, power amplifiers are often included in devices, such as, mobile phones to amplify a RF signal for transmission. For example, in devices supporting Global System for Mobile Communications (GSM) (or 2G devices), wideband code division multiple access (W-CDMA) (or 3G devices) and/or Long Term Evolution Advanced (LTE-A) (or 4G devices), a power amplifier is often used for RF signal amplification.

It may be beneficial to manage the amplification of RF signals because the desired transmit power level can vary in dependence on a number of factors including the distance between the user and a base station and/or the mobile environment. In mobile devices, in particular, the power consumption of a power amplifier can be an important consideration. One technique for reducing power consumption of a power amplifier is envelope tracking (ET), in which the voltage level of the power supply of the power amplifier is varied or controlled in relation to the envelope of the RF signal. Thus, when the envelope of the RF signal increases, the voltage supplied to the power amplifier is also increased. Likewise, when the envelope of the RF signal decreases, the voltage supplied to the power amplifier is decreased, thereby to reduce power consumption.

SUMMARY

In a first aspect, this specification describes apparatus comprising: envelope signal amplification circuitry configured to receive an input envelope signal indicative of an envelope of an input radio frequency signal and to output an amplified envelope signal; and a radio frequency power amplifier configured to receive a radio frequency control signal which is dependent on the input radio frequency signal and the input envelope signal and, using the amplified envelope signal as its supply voltage, to output an amplified radio frequency signal.

The apparatus may further comprise inversion circuitry configured to invert the input envelope signal, the radio frequency control signal being dependent on the input radio frequency signal and the inverted input envelope signal. The inversion circuitry may comprise an inverter amplifier configured actively to invert the input envelope signal. Alternatively, the inversion circuitry may comprise a transformer configured passively to invert the input envelope signal. The primary winding of the transformer may be configured to receive the input envelope signal, and the primary winding and the secondary winding may be oppositely configured.

The envelope signal amplification circuitry may comprise a transistor, the input envelope signal being provided to the gate/base of the transistor.

The radio frequency power amplifier may comprise a radio frequency transistor, the radio frequency control signal being provided to the gate/base of the radio frequency transistor.

The apparatus may comprise a comparator configured to receive a pre-input envelope signal and the amplified envelope signal and to output the input envelope signal.

The envelope signal amplification circuitry may comprise a plurality of envelope signal amplification modules, the input envelope signal being selectively provided to one of the plurality of envelope signal amplification modules in dependence on a first property associated with the input envelope signal. Each envelope signal amplification module may be provided with a voltage supply having a different magnitude. Each of the envelope signal amplification modules may have an associated current regulator array. At least one of the current regulators in each array may be individually connectable in dependence on a second property associated with the input envelope signal. Each current regulator in the array may have different constant current level. Each of the envelope signal amplification modules may have associated inversion circuitry configured to invert the input envelope signal.

Each of the input envelope signal and the input radio frequency signal may be pre-distorted. The apparatus may comprise an envelope signal pre-distorter configured to cause the input envelope signal to be pre-distorted, and an input radio frequency signal pre-distorter configured to cause the input radio frequency signal to be pre-distorted. The apparatus may comprise a feedback channel configured to deliver a feedback signal indicative of the amplified radio frequency signal or a signal derived from the feedback signal to the envelope signal pre-distorter and/or the input radio frequency signal pre-distorter, the envelope signal pre-distorter and/or the input radio frequency signal pre-distorter being configured to adapt its pre-distortion based on the feedback signal or the derived signal. The feedback channel may comprise a switch feature configured to switch the channel between delivery of the feedback signal or the signal derived from the feedback signal to the envelope signal pre-distorter and delivery of the feedback signal or the signal derived from the feedback signal to the input radio frequency signal pre-distorter. The envelope signal pre-distorter and the input radio frequency signal pre-distorter may both be digital pre-distorters or analogue pre-distorters, or one of the envelope signal pre-distorter and the input radio frequency signal pre-distorter may be an analogue pre-distorter and the other may be a digital pre-distorter.

The apparatus may be a communications device comprising an antenna configured to transmit the amplified radio frequency signal.

In a second aspect, this specification describes a method comprising amplifying an input envelope signal indicative of an envelope of an input radio frequency signal to form an amplified envelope signal, and amplifying, using the amplified envelope signal as the supply voltage, a radio frequency control signal to form an amplified radio frequency signal, wherein the radio frequency control signal is dependent on the input radio frequency signal and the input envelope signal.

The method may comprise inverting the input envelope signal, the radio frequency control signal being dependent on the input radio frequency signal and the inverted input envelope signal. The method may comprise actively inverting the input envelope signal using an inverter amplifier. Alternatively, the method may comprise passively inverting the input envelope signal using a transformer.

The method may comprise providing the input envelope signal to the gate/base of transistor for amplifying input envelope signal.

The method may comprise providing the radio frequency control signal to the gate/base of a radio frequency transistor for amplifying the radio frequency control signal.

The method may comprise receiving at a comparator a pre-input envelope signal and the amplified envelope signal and providing by the comparator the input envelope signal.

The method may comprise selectively providing the input envelope signal to one of a plurality of envelope signal amplification modules for amplifying the input envelope signal, selection of the one of the envelope signal amplification modules being in dependence on a first property associated with the input envelope signal. The method may comprise providing each envelope signal amplification module with a voltage supply having a different magnitude. Each of the envelope signal amplification module may have an associated current regulator array, and the method may comprise individually connecting at least one of the current regulators in the array in dependence on a second property associated with the input envelope signal.

The method may comprise causing each of the input envelope signal and the input radio frequency signal to be pre-distorted. The method may comprise: an envelope signal pre-distorter causing the input envelope signal to be pre-distorted, and an input radio frequency signal pre-distorter causing the input radio frequency signal to be pre-distorted. The method may comprise: delivering a feedback signal indicative of the amplified radio frequency signal or a signal derived from the feedback signal to the envelope signal pre-distorter and/or the input radio frequency signal pre-distorter; and the envelope signal pre-distorter and/or the input radio frequency signal pre-distorter adapting its pre-distortion based on the feedback signal of the derived signal. The method may comprise switching between delivery of the feedback signal or the signal derived from the feedback signal to the envelope signal pre-distorter and delivery of the feedback signal or the signal derived from the feedback signal to the input radio frequency signal pre-distorter.

The method may comprise using the amplified radio frequency signal to drive an antenna.

In a third aspect, this specification describes apparatus comprising: means for amplifying an input envelope signal indicative of an envelope of an input radio frequency signal to form an amplified envelope signal; and means for amplifying, using the amplified envelope signal as the supply voltage, a radio frequency control signal to form an amplified radio frequency signal, wherein the radio frequency control signal is dependent on the input radio frequency signal and the input envelope signal. The apparatus may further comprise means for performing any of the functionality described with reference to the first and second aspects.

In a fourth aspect, this specification describes apparatus comprising: envelope signal amplification circuitry configured to receive an input envelope signal indicative of an envelope of an input radio frequency signal and to output an amplified envelope signal; and a radio frequency power amplifier configured to receive a radio frequency control signal and, using the amplified envelope signal received from the envelope signal amplification circuitry as its supply voltage, to output an amplified radio frequency signal, wherein each of the input envelope signal and the input radio frequency signal is pre-distorted. The apparatus may comprise any of the features relating to pre-distortion as described with reference to the first aspect. In addition or alternatively, the apparatus may further comprise the plurality of envelope signal amplification modules as described with reference to the first aspect.

In a fifth aspect, this specification describes apparatus comprising: a plurality of envelope signal amplification modules each configured to receive an input envelope signal indicative of an envelope of a input radio frequency signal and to output an amplified envelope signal; a radio frequency power amplifier configured to receive a radio frequency control signal and, using the amplified envelope signal received from one of the plurality of envelope signal amplification modules as its supply voltage, to output an amplified radio frequency signal; and a switch feature configured to select one of the plurality of envelope signal amplification modules to receive the input envelope signal based on a property associated with the input envelope signal. The apparatus may comprise any of the features relating to pre-distortion as described with reference to the first aspect. In addition or alternatively, the apparatus may further comprise any of the features relating to the plurality of envelope signal amplification modules as described with reference to the first aspect.

BRIEF DESCRIPTION OF THE FIGURES

For a more complete understanding of example embodiments of the present invention, reference is now made to the following description taken in connection with the accompanying drawings in which.

DETAILED DESCRIPTION OF EXAMPLES OF EMBODIMENTS

Figure 1:
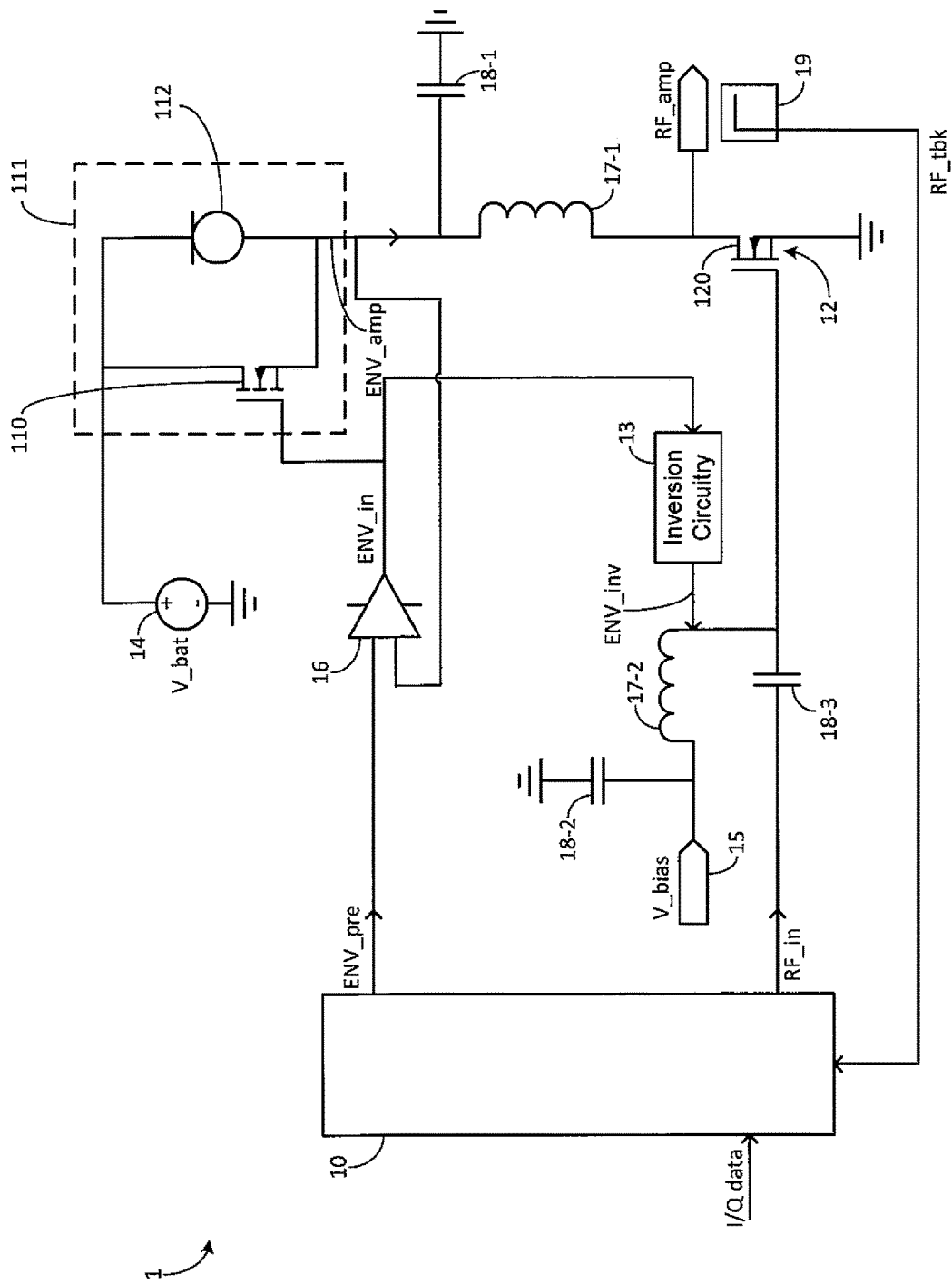
FIG. 1 is a schematic, generalised illustration of an example of a circuit for amplifying radio frequency signals.

In the description and drawings, like reference numerals refer to like elements throughout.

FIG. 1 is a generalised schematic of apparatus 1, also referred to as circuitry, for providing an amplified RF signal for, for example, wireless transmission via an antenna (not shown). The circuitry 1 may form part of a communications device. In some examples, the circuitry 1 may be incorporated into a portable communications device which includes an antenna. Examples of such communication devices include, but are not limited to mobile telephones, media players, laptop computers, tablet computers, positioning devices and PDAs.

In general terms, the circuitry 1 comprises envelope signal amplification circuitry 11 and a radio frequency power amplifier 12. The envelope signal amplification circuitry 11 is configured to receive an input envelope signal (denoted ENV_in in FIG. 1), which is indicative of the envelope of an input radio frequency signal (denoted RF_in), and to output an amplified envelope signal (denoted ENV_amp). The radio frequency power amplifier 12 is configured to receive a radio frequency control signal (denoted RF_ctrl) and, using the amplified envelope signal as its supply voltage, to output an amplified radio frequency signal (denoted RF_amp). The radio frequency control signal for controlling the output of the radio frequency power amplifier is dependent on both the input radio frequency signal and the input envelope signal. The amplified radio frequency signal may be suitable for driving an antenna of a communications device in which the circuitry 1 is incorporated.

The circuitry 1 may further comprise inversion circuitry 13 which is configured to receive the input envelope signal. The inversion circuitry 13 is configured to invert the input envelope signal and to output an inverted envelope signal (denoted ENV_inv). The inverted envelope signal contributes towards, or is a component of, the RF control signal. As such, the RF control signal may be said to be, more specifically, dependent on the inverted envelope signal and the input RF signal.

In the example of FIG. 1, the envelope signal amplification circuitry 11 comprises a transistor 110. The input envelope signal is provided to the gate/base terminal of the transistor 110. As such, the current flowing between the source/collector and the emitter/drain terminals is modulated based on the input envelope signal. More specifically, the current flowing between the source/collector and the emitter/drain terminals increases when the voltage corresponding to the input envelope signal increases. Similarly, the current flowing between the source/collector and the emitter/drain terminals decreases when the voltage corresponding to the input envelope signal decreases. Ideally, the transistor 110 is linear, such that the current flowing through the transistor 110 changes proportionally with the voltage applied to the gate/base terminal. However, as will be appreciated, and as is discussed below, absolute linearity may not be possible.

A voltage source 14 provides a voltage (denoted V_bat) to one of the source/collector and drain/emitter terminals. In this example, the transistor 110 is an N channel transistor, specifically an insulated gate N channel depletion type field effect transistor, and so the voltage is applied to the drain terminal.

As will be understood, the transistor 110 effectively amplifies the input envelope signal to produce the amplified envelope signal. The amplified envelope signal is then used as the supply voltage for the RF power amplifier 12. In this example, the RF power amplifier 12 comprises a RF transistor 120. As such, the amplified envelope signal is provided to one of the source/collector and drain/emitter terminals of the RF transistor 120. In this example, the transistor 110 is an N channel transistor, specifically an insulated gate N channel enhancement type field effect transistor, and so the amplified envelope signal is applied to the drain terminal.

The RF control signal is provided to the gate/base terminal of the RF transistor 120. As such, the current flowing between the source/collector and the drain/emitter terminals is modulated based on the RF control signal. More specifically, the current flowing between the source/collector and the emitter/drain terminals increases when the voltage corresponding to the RF control signal increases. Similarly, the current flowing between the source/collector and the emitter/drain terminals decreases when the voltage corresponding to the RF control signal decreases. As with the transistor 110 of the envelope amplification circuitry 11, the RF transistor 120 is ideally linear.

The RF control signal may be formed of the input RF signal, the inverted envelope signal and a biasing voltage (denoted V_bias) provided by a voltage source 15. Because the RF control signal is dependent on the input envelope signal (specifically, following its inversion), the current flowing between the source/collector and drain/emitter terminals of the RF transistor 120 is, at least in part, dependent on the input envelope signal. Moreover, the current flowing through the RF transistor 120 is also dependent on its supply voltage. As the supply voltage to the RF transistor 120 is the amplified envelope signal (which is, of course, dependent on the input envelope signal), the current flowing through the RF transistor 120 could be said to be doubly-modulated by the input envelope signal. The amplified RF signal, which is the output of the RF amplifier 12 may, therefore, also be said to be doubly-modulated by input envelope signal. The effect of this double modulation is that the current flowing through the envelope amplification circuitry 11 which is not required for amplification of the input RF signal (or, put another way, the redundant current) is sunk through the RF transistor 120. This sinking process is described in more detail below.

Because the RF control signal is dependent on the inverted envelope signal, when the input envelope signal (and so also the amplified envelope signal) increases, the RF control signal decreases. The effect of this is that, when the input envelope signal is high, the conductivity of the envelope amplification circuitry 11 is high but the conductivity of the RF amplifier 120 is low (as RF_ctrl is low). This means that current may flow more easily through the envelope amplification circuitry 11 but less easily through the RF amplifier 120. As such, charge builds up at, in this example, the drain terminal of the RF transistor 120 and so the voltage across the RF amplifier 12, upon which the amplified RF signal is dependent, is high when the input envelope signal is high. When the input envelope signal decreases, current flow through the envelope amplification circuitry 11 is restricted and in addition, because the RF control signal increases when the envelope input signal decreases, current is able to flow more easily through the RF amplifier 12. Consequently, the voltage across the RF amplifier 12, and so also the amplified RF signal, is reduced. Put another way, when the input envelope signal reduces, the excess charge at, in this case, the drain terminal of the RF transmitter is sunk through the RF amplifier 12, thereby reducing the amplified RF signal.

The envelope signal amplification circuitry 11 and the RF amplifier 12 could be said to be arranged in a "push-pull" configuration, with the envelope signal amplification circuitry 11 "pushing" charge towards the RF amplifier 12 to increase the amplified RF signal and the RF amplifier 12 "pulling" charge to ground (or the low voltage level) to reduce the amplified RF signal. The use of the RF amplifier to sink redundant current provides a more simplified circuit than in some prior art devices in which an additional dedicated transistor is utilised as the "pull" part of the push-pull arrangement to sink redundant current. This additional dedicated "pull" transistor typically has some degree of power loss associated with it. As such, the use of the RF amplifier to sink redundant current as described herein may provide a more power-efficient, and a more compact, envelope tracking RF amplification system Now that the general operation of the circuitry 1 has been explained, the configuration of the example circuitry 1 of FIG. 1 will be described in more detail.

The circuitry 1 may comprise pre-processing circuitry 10 configured to receive I and Q data which is indicative of an RF signal for transmission and to output the input RF signal, RF_in, and a pre-input envelope signal, denoted ENV_pre, which is indicative of the envelope of the input RF signal. The operation of the pre-processing circuitry 10 is described in more detail with reference to FIGS. 8 to 11.

The pre-input envelope signal may then be provided as a first input of a comparator 16. The second input to the comparator 16 is the amplified envelope signal which is output by the envelope amplification circuitry 11. The voltage supply for the comparator 16 may be V_bat. In the example of FIG. 1, the comparator 16 is an operational amplifier although, as will be appreciated, other types of comparator may be used. The output of the comparator 16 is the input envelope signal, ENV_in, discussed above. The input envelope signal is provided to the envelope amplification circuitry 11 and to the inversion circuitry 13.

The envelope amplification circuitry 11 may comprise one or more constant current regulator 112. The one or more constant current regulator 112 may comprise, for example, a constant current diode or a BUCK converter. Each of the one or more constant current regulator 112 is configured to allow the current flowing through it to rise to a certain level and then to maintain that level. Each constant current regulator 112 may be connected in parallel with the transistor 110. As such, a first terminal of the constant current regulator 112 may be coupled with the source/collector terminal of the transistor 110 and the second terminal may be coupled to the drain/emitter of the transistor 110. The constant current regulator 112 may act to regulate the average current that is output by the envelope signal amplification circuitry 11. Although not shown in FIG. 1, each constant current regulator 112 may have a different constant current level and may be individually connectable, based on a property of, or related to, the input envelope signal. A switchable array of current regulators 112 such as this may be as described with reference to FIGS. 5 and 7.

As mentioned previously, the output of the envelope amplification circuitry, ENV_amp, is provided to the RF amplifier 12. The amplified envelope signal may be also provided as a feedback signal to the comparator 16. An output terminal of the envelope amplification circuitry 11, via which the amplified envelope signal is provided, is coupled to one of the drain/emitter and source/collector terminals of the RF transistor 120. The other one of the drain/emitter and source/collector terminals of the RF transistor 120 is connected to ground. In this example, the source/collector terminal of the RF transistor 120 is connected to ground.

As shown in FIG. 1, the output terminal of the envelope amplification circuitry may be electrically connected to the terminal of the RF amplifier 12, via a first inductor 17. Put another way the output terminal of the envelope amplification circuitry 11 may be connected to a first terminal of the first inductor 17-1 and the terminal of the RF amplifier 12 may be connected to the second terminal of the first inductor 17-1. The output terminal of the envelope amplification circuitry 11 may also be coupled to ground via a first capacitor 18-1. As such, a first terminal of the first capacitor 18-1 may be connected to the output terminal of the envelope amplification circuitry 11 and the second terminal of the first capacitor 18-1 may be connected to ground. The first terminal of the first capacitor 18-1 may be also connected to the first terminal of the first inductor 17-1. The first inductor 17-1 may act to filter out, or remove, high frequency noise which may be present in the current associated with the amplified envelope signal. The first capacitor 18-1 may serve to filter out, or remove, high frequency noise which may be present in the voltage associated with the amplified envelope signal. If these high frequency noise components are not removed, they may cause distortion in the amplified RF signal. Although, in this example, filtering is performed using the first inductor and first capacitor, it will be appreciated that these may be replaced by any suitable filtering circuitry which is configured to filter the noise components from the amplified envelope signal.

The output of the inversion circuitry 13 may be connected to a second terminal of a second inductor 17-2. The first terminal of the second inductor 17-2 may be connected to the voltage source 15. The voltage source 15 may also be connected to ground via a second capacitor 18-2. As such, the first terminal of the second capacitor 18-2 may be connected to the voltage source and the second terminal of the second capacitor 18-2 may be connected to ground. In addition, the first terminal of the second capacitor 18-2 may be connected to the first terminal of the second inductor 17-2. The input RF signal may be connected to the gate/base terminal of the RF transistor 120 via a third capacitor 18-3. Put another way, the output terminal of the pre-processing circuitry 10 which provides the input RF signal may be connected to a first terminal of the third capacitor 18-3 and the second terminal of the third capacitor 18-3 may be connected to the gate/based terminal of the RF transistor 120. The second terminal of the third capacitor 18-3 may be also connected to the output terminal of the inversion circuitry 13 and to the second terminal of the second inductor 17-2. As will be understood from FIG. 1, the RF control signal, RF_ctrl, that is provided to the gate/base of the RF transistor 120 may be the sum of the input RF signal, RF_in, the biasing voltage V_bias and the inverted envelope signal, ENV_inv. The second inductor 17-2 may act to filter out, or remove, high frequency noise which may be present in the current associated with the inverted envelope signal. The second capacitor 18-2 may act to filter out, or remove, high frequency noise which may be present in the voltage associated with the inverted envelope signal. The removal of the high frequency noise components may improve the stability of the operation of the RF power amplifier 12. Although, in this example, filtering is performed using the second inductor and second capacitor, it will be appreciated that these may be replaced by any suitable filtering circuitry which is configured to filter the noise components from the inverted envelope signal.

The circuitry 1 may also comprise a coupler 19 coupled to the output of the RF amplifier 12. An output of the coupler 19 also referred to as the feedback signal (denoted on FIG. 1 as RF_fbk) may be fed back to the pre-processing circuitry 10. The way in which the feedback signal is utilised is described below with reference to FIGS. 8 to 11. The feedback signal is indicative of the amplified RF signal.

Figure 2:
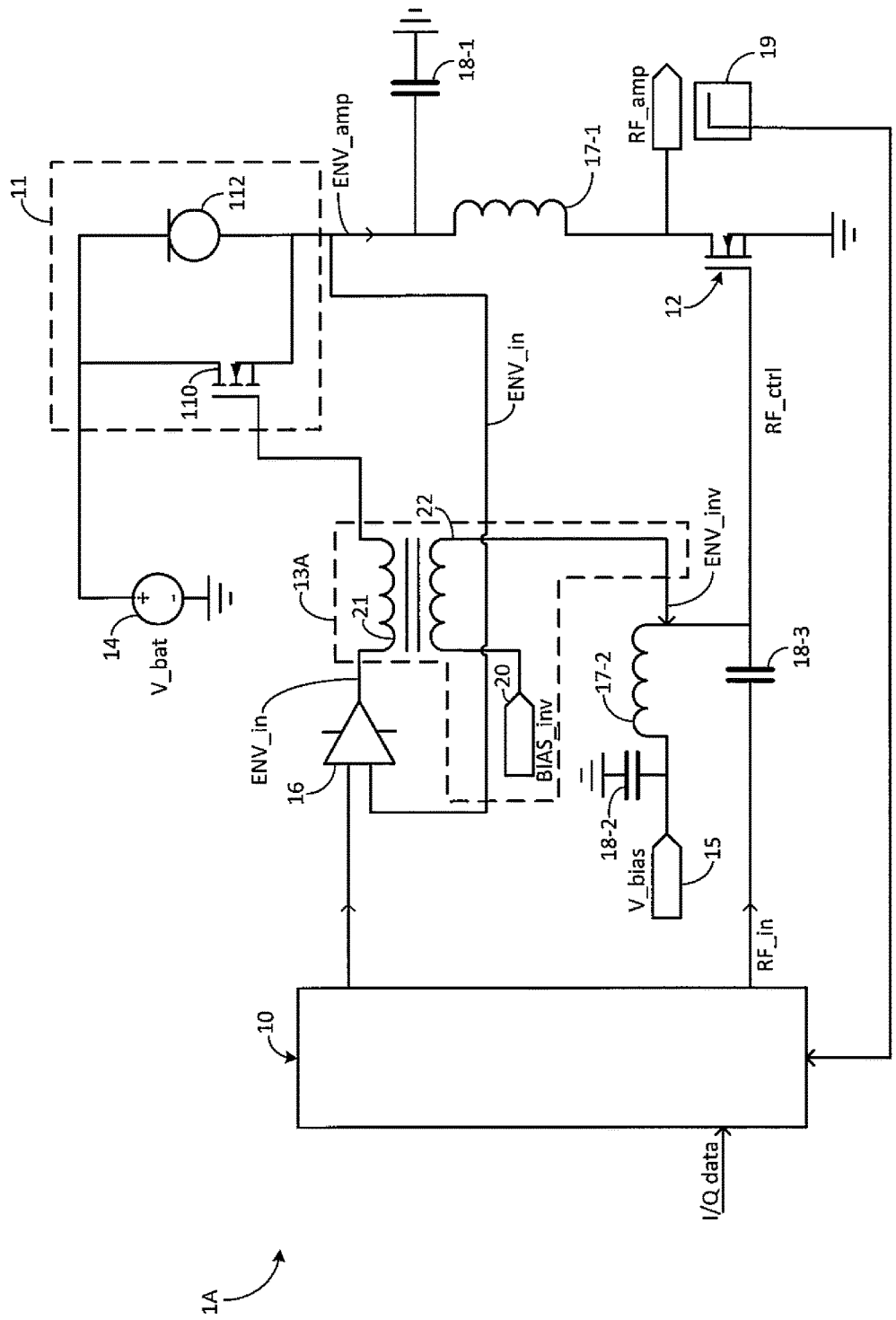
FIG. 2 is a more specific example of the circuit of FIG. 1.

FIG. 2 is a more specific illustration of the circuitry 1 of FIG. 1. In particular, FIG. 2 shows a specific example of the inversion circuitry 13 of FIG. 1. In FIG. 2, the inversion circuitry, denoted 13A, comprises a transformer 21, 22. In addition the inversion circuitry 13A may comprise a voltage source 20. The voltage source 20 may be configured to provide a biasing voltage, also referred to as the inversion bias (denoted BIAS_inv) to the secondary winding 22 of the transformer 21, 22. The transformer 21, 22 may be configured to invert the input envelope signal, ENV_in, passively.

In the example of FIG. 2, the primary winding 21 of the transformer 21, 22 is connected in series between the output of the comparator 16 and an input of the envelope amplification circuitry 11. Put another way, a first terminal of the primary winding 21 may be connected to the output of the comparator and a second terminal may be connected to the envelope amplification circuitry 11. A first terminal of the secondary winding 22 may be connected to the voltage source 20 and the second terminal provides the inverted envelope signal for use in forming the RF control signal. As will be understood, changing current flowing in the primary winding due to the envelope input signal ENV_inv causes a signal to be induced in the secondary winding 22. The sign of the signal induced in the secondary winding 22 is opposite to the sign of the signal in the primary winding 21. Put another way, the primary and secondary windings 21, 22 are oppositely configured (or connected). In this way, the output of the inversion circuitry 13A is an inverted version of the input envelope signal ENV_in. The turns-ratio of the transformer 21, 22 may be altered to change the magnitude of the inverted envelope signal. This may be performed to optimise the system for different RF transistors 120 and different operating conditions.

Figure 3:
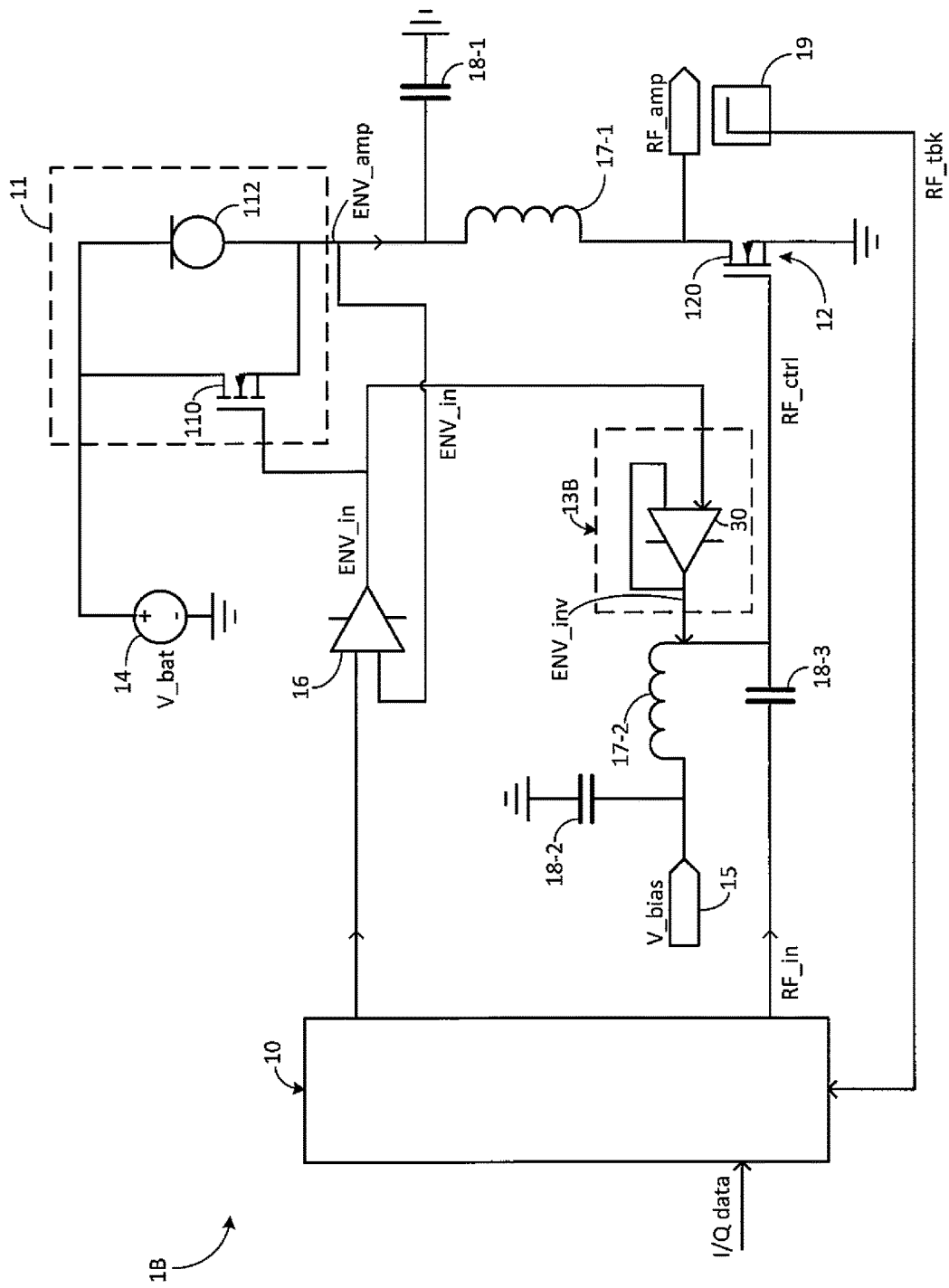
FIG. 3 is an alternative to the example of FIG. 2.

FIG. 3 shows an example of an alternative to the circuit 1A of FIG. 2. The circuit 1B of FIG. 3 is the same as that described with reference to FIG. 1. In this example, the inversion circuitry 13B comprises an inverter amplifier 30 to actively invert the input envelope signal. The input envelope signal may be provided to the inverter amplifier 30 and the inverted envelope signal may subsequently be output. The voltage supply to the inverter amplifier may be adjusted thereby to change the magnitude of the inverted envelope signal.

It will of course be appreciated that the specific inversion circuitries 13A and 13B depicted in FIGS. 2 and 3 are examples only and that envelope input signal may be inverted to form the inverted envelope signal in any other suitable way.

Figures 4, 5:
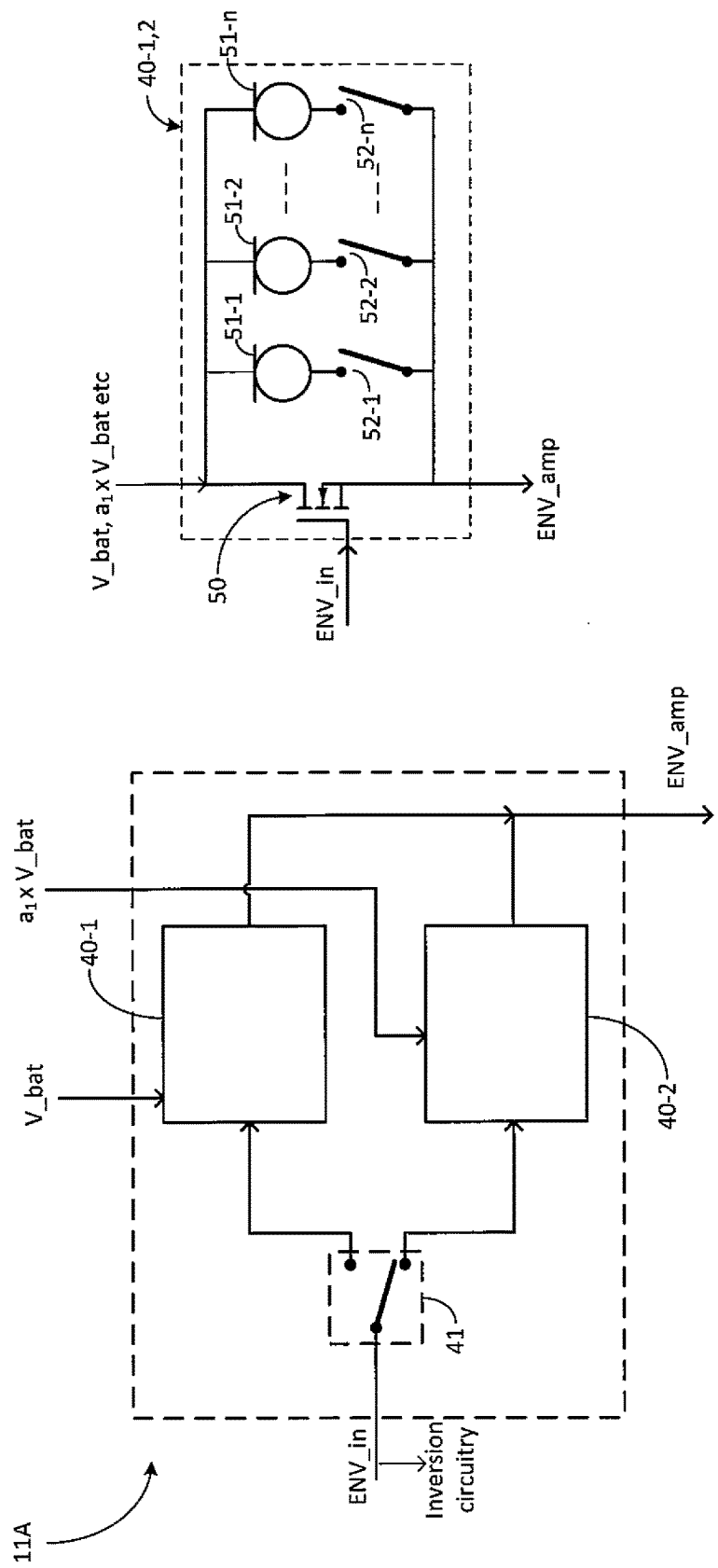
FIG. 4 is an example of alternative envelope signal amplification circuitry which may be used in place of the envelope signal amplification circuitry shown in FIGS. 1 to 3.
FIG. 5 is an example of a constituent part of the circuitry of FIG. 4.

FIG. 4 is a schematic illustration of alternative envelope amplification circuitry 11A to that shown in FIGS. 1 to 3. The envelope amplification circuitry 11A of FIG. 4 may be incorporated into the circuit of FIGS. 1 to 3 in place of the envelope amplification circuitry 11 shown in those Figures. As with the envelope amplification circuitry 11 described with reference to FIGS. 1 to 3, the envelope amplification circuitry 11A of FIG. 4 may be configured to receive the input envelope signal, ENV_in, and a voltage supply and to output the amplified envelope signal, ENV_amp, for use as the voltage source of the RF amplifier 12.

In the example of FIG. 4, the envelope amplification circuitry 11A comprises a switchable array of plural envelope amplification modules 40-1, 40-2. In this example, the envelope amplification circuitry 11A comprises two envelope amplification modules 40-1, 40-2 although, as will be appreciated, it may instead comprise more than two. The envelope amplification circuitry 11A also comprises a switch feature 41 configured to route the input envelope signal selectively to one of the envelope amplification modules 40-1, 40-2 of the array. As such, the amplification modules in the array could be said to be individually selectable. The switch feature 41 may be of any suitable type. The switch feature 41 is configured to switch between the amplification modules 40-1, 40-2 of the array in dependence on a property of the input envelope signal. The property of the input envelope signal may comprise its instantaneous voltage. As such, the switch feature 41 may be configured to route the input envelope signal to a first of the amplification modules 40-1 if the voltage of the input envelope signal is below a threshold voltage and to route the input envelope signal to a second of the amplification modules 40-2 if the magnitude of the input envelope signal is above the voltage threshold. Therefore, as the input envelope signal varies, it is selectively routed to different amplification modules 40-1, 40-2 of the array. It will of course be understood that in arrays with more than two envelope amplification modules 40-1, 40-2, more than one voltage threshold may be employed. For example, if the voltage of the envelope signal is below a first threshold, the signal may be routed to a first amplification module, if the voltage of signal is above the first threshold but below a second threshold, it may be routed to a second amplification module and, if the voltage is above the second threshold, the input envelope signal may be routed to a third amplification module. It may, therefore, be said that each amplification module 40-1, 40-2 in the array is associated with a different range of input envelope voltage levels.

Although not shown in FIG. 4, switching of the switch feature 41 may be controlled in dependence on the output of a comparator, which is not shown in the Figures. The comparator may receive as a first input a version of the input envelope signal and as a second input a reference signal associated with the switching threshold. The output of the comparator changes depending on whether the version of the input envelope signal is above or below the reference signal. In some specific examples, the version of the input envelope signal may be a normalised version having its maximum value as one and its minimum value as zero. The reference signal may then be a value between zero and one (for example, a value equal to coefficient $a_1$, which is associated with the threshold and is mentioned below). It will of course be appreciated that in other examples, the switch feature 41 may be controlled in any suitable way, for example using a processing module. In examples having more than two amplification modules 40-1, 40-2 in the array, an arrangement of plural comparators may be used to control the switching or, alternatively, the switching may be controlled by a processing module.

The voltage supplied to each of the amplification modules 40-1, 40-2 may be different and its value may be related to the range of voltages with which the amplification module is associated. More specifically, the voltage supplied to an amplification module may be related to one of the thresholds which define the range of input envelope voltage levels with which a particular amplification module 40-1, 40-2 is associated. Put another way, the voltage supplied to a particular amplification module may be related to the voltage level at which the switch feature 41 switches to/from that amplification module 40-1, 40-2. As such, the voltages supplied to the amplification modules 40-1, 40-2 in the array may increase with the average voltage of the range with which the amplification module is associated.

In a specific example, the voltage supplied to each of the amplification modules 40-1, 40-2 may be related to the maximum voltage of the range of voltages with which the amplification module is associated. For example, in an array including two modules and one switching threshold having a value of a first constant (or coefficient) a1 multiplied by a maximum voltage value of the input envelope signal (e.g. $a_1 \times$ENV_MAX), the voltage supply of the amplification module 40-2 to which the input envelope signal is routed when the input envelope signal is in the range ENV_MIN to $a_1 \times$ENV_MAX (or is immediately below the threshold) may be the same first constant $a_1$ multiplied by a maximum supply voltage (e.g. $a_1 \times$V_BAT). When the input envelope signal is above the first threshold (e.g. is in the range $a_1 \times$ENV_MAX and ENV_MAX), the voltage supply of the amplification module 40-1 to which it is routed may be the maximum supply voltage (e.g. V_BAT). So, in general terms, the voltage level supplied to an amplification module which receives the input envelope signal when the voltage of the signal is immediately a below a threshold having a value of a constant (or coefficient) multiplied by the maximum envelope signal may be equal to the same constant (or coefficient) multiplied by a maximum supply voltage level.

Now let us consider an example in which there are four different amplification modules in the array. In such an example, there may three different threshold levels of the input envelope signal ($a_3 \times$ENV_MAX, $a_2 \times$ENV_MAX and $a_1 \times$ENV_MAX where $0<a_3<a_2<a_1<1$). As such, the switch 50 may be configured to route the input envelope signal to a first amplification module when the input envelope signal is between the minimum level V_MIN and a first threshold e.g. $a_3 \times$ENV_MAX, to route it to a second amplification module when it is between the first threshold $a_3 \times$ENV_MAX and a second threshold $a_2 \times$ENV_MAX, to route it to a third amplification module when the voltage is between the second threshold $a_2 \times$ENV_MAX and a third threshold $a_1 \times$ENV_MAX and to route the input envelope signal to the fourth amplification module when the voltage is above the third threshold $a_1 \times$ENV_MAX. The levels of the voltage supplies to the first to fourth amplification module may be $a_3 \times$V_BAT, $a_2 \times$V_BAT, $a_1 \times$V_BAT and V_BAT respectively.

By having an array of amplification modules each having a different supply voltage and by selectively routing the input envelope signal to amplification modules having a higher supply voltage as the input envelope signal increases, the efficiency of the system may be improved. This is because an additional number of peak efficiency points may be provided. The number of additional peak efficiency points may be dependent on the number of amplification modules each having a different supply voltage. As such, a more constant efficiency over the whole range of input envelope signals may be achieved (as a result of the additional peak efficiency points). This may be particularly beneficial for a system which is configured to operate using a number of different protocols with high peak to average power ratio. For example, the peak to average power ratio of a 4G signal envelopes is significantly higher that the peak to average power ratio of a 3G signal envelopes and whereas prior art systems may be suitable for use with any one of these protocols, the circuits described herein may provide a substantially constant efficiency over the whole range of power levels.

FIG. 5 is a schematic illustration of components which may form the amplification modules 40-1, 40-2 of FIG. 4. As with the envelope amplification circuitry 11 of FIGS. 1 to 3, the amplification module 40-1, 40-2 comprises a transistor 50. The voltage supply is connected to one of the source/collector and drain/emitter terminals of the transistor 50. As discussed with reference to FIG. 4, the level of the voltage supply may be dependent on the particular range of input envelope signal levels with which the amplification module is associated. The output of the amplification module at which the amplified envelope signal is provided is connected to the other one of the source/collector and drain/emitter terminals of the transistor 50. The input envelope signal is provided to the gate/base terminal of the transistor 50. In this example, the transistor 50 is an insulated gate field effect transistor (IGFET), specifically an N-channel depletion type IGFET. As such, the voltage source 14 is connected to the drain terminal of the transistor 50, the output of the amplification module 40-1, 40-2 is connected to the source terminal of the transistor 50, and the input envelope signal is provided to the gate terminal of the transistor 50.

The amplification module 40-1, 40-2 may also comprise an array of current regulators 51-1 to 51-n. Each current regulator may be as described with reference to the current regulator 112 of FIG. 1. The constant current level of each of the current regulators 51-1 to 51-n in the array may be different to one another. The current regulators 51-1 to 51-n of the array may be connected in parallel with one another and may be connected in parallel with the source/collector and drain/emitter terminals of the transistor 50.

Each current regulator 51-1 to 51-n may have an associated switch 52-1 to 52-n for selectively connecting the current regulator 51-1 to 51-n to the output of the amplification module 40-1, 40-2. The switches 52-1 to 52-n may be utilized in order to change the power ratio between the transistor 50 and the current regulator array 51-1 to 51-n. This may improve the efficiency of the envelope amplification module 40-1, 40-2. The switches 52-1 to 52-n may be controlled in dependence on a property associated with the input envelope signal level. Put another way, the current regulators 51-1 to 51-n may be selectively connected to the output of the amplification module 40-1, 40-2 based on a property of the input envelope signal level. More specifically, the switchable array of current regulators 51-1 may be configured such that, as the instantaneous RMS power of the input envelope signal changes, different current regulators 51-1 to 51-n in the array or different combinations of current regulators in the array of current regulators are connected in parallel with the transistor 50. In particular, the current regulator, or combination of current regulators, may be selected so as to provide a current level that is most suitable for the RMS power of the input envelope signal.

The switches 52-1 to 52-n of the switchable array may be controlled in any suitable way. For example, the switches 52-1 to 52-n may be controlled by a baseband processing block or module (not shown in the Figures). The processing module may be configured to detect, based on the envelope input signal which may be provided to the processing block, the RMS power of the signal. The processing block may then estimate the average current associated with the detected RMS power. The average current may be estimated using a look-up table to determine a current level which is associated with the detected RMS power. The processing block then controls the switches 52-1 to 52-n, based on the detected RMS power, so as to provide a current that is as close as possible to the estimated average current. As was mentioned above, different combinations of current regulators from the array may be connected simultaneously so as to provide different current levels.

By implementing a switchable array of current regulators 51-1 to 51-n in at least one of the amplification modules of the switchable array of amplification modules, the efficiency of the system may be further improved. This is because additional peak efficiency points are provided between those provided by the switchable array of envelope amplification modules. The number of different peak efficiency points may be dependent on the number of different current levels that can be provided by the switchable current regulator array. In particular, it may ensure that the efficiency of the circuit is maintained at a more constant level as the input envelope signal increases between the input envelope signal thresholds at which the switch feature 42 switches between different amplification modules in the array.

In the above, it is described that the switching between amplification modules 40-1, 40-2 and/or switching between current regulators 51-1 to 51-n is performed in dependence on properties of the input envelope signal. However, it will, of course be appreciated that the switching may instead be controlled based on properties of the pre-input envelope signal. As the input envelope signal is an amplified version of the pre-input envelope signal, the properties of the two signals may be associated with, or related to, one another. As such, the properties of the input envelope signal and the properties of the pre-input envelope signal may both be referred to as properties associated with, or related to, the input envelope signal.

Figure 7:
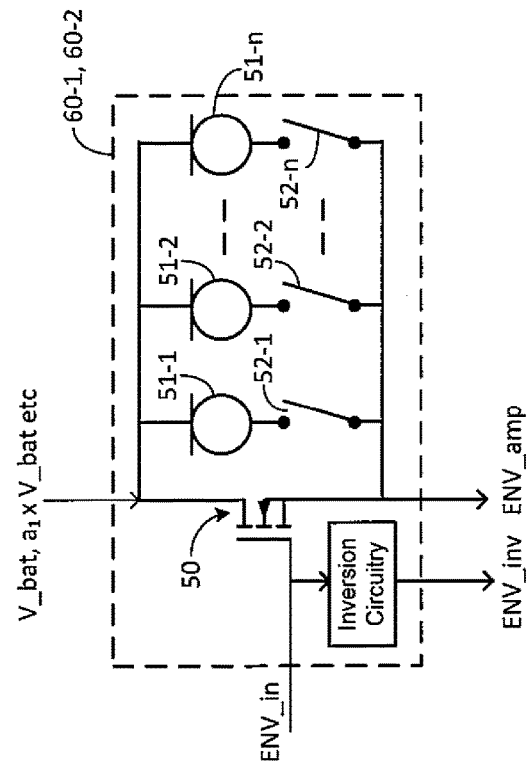
FIG. 7 is an example of a constituent part of the circuitry of FIG. 6.
Figure 6:
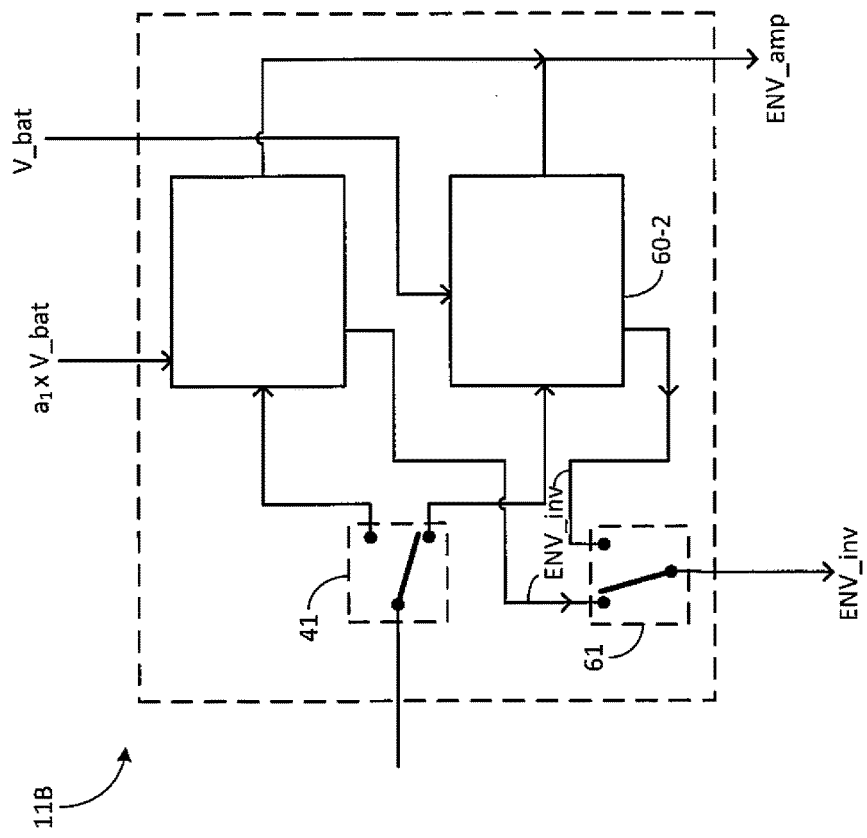
FIG. 6 is another example of envelope signal amplification circuitry which may be used in place of the envelope signal amplification circuitry shown in FIGS. 1 to 3.

FIGS. 6 and 7 show alternative envelope signal amplification circuitry 11B to that shown in FIGS. 1 to 3 and 4 and 5. The envelope signal amplification circuitry 11B shown in FIGS. 6 and 7 may be incorporated into the circuit of FIGS. 1 to 3 in place of the envelope amplification circuitry 11 shown in those Figures. Similarly to the circuitry 11A of FIGS. 4 and 5, the circuitry 11B comprises a switchable array of amplification modules 60-1, 60-2 with the switch feature 41 being configured to selectively route the input envelope signal to different ones of the amplification modules 60-1, 60-2 based on a property (which may be the instantaneous voltage level) associated with the input envelope signal. As described with reference to FIGS. 4 and 5, each amplification module 60-1, 60-2 may be supplied with a voltage supply having a different level. In addition, each amplification module 60-1 to 60-2 may include a transistor 50 and a switchable array of current regulators 51-1 to 51-n each having a different constant current level. As described with reference to FIG. 5, the switches 52-1 to 52-n of the current regulator array may be controlled by a processing module in dependence on a property (which may be the instantaneous RMS power) associated with the input envelope signal.

The main difference in the circuitry 11B of FIGS. 6 and 7 is that each amplification module 60-1, 60-2 may additionally include associated inversion circuitry 70 for generating the inverted envelope signal, for use in generating the RF control signal, when the input envelope signal is routed to that amplification module 60-1, 60-2. The envelope signal amplification circuitry 11B may, therefore, include a second switch feature 61 configured to route the generated inverted envelope signal towards the gate/base terminal of the RF amplifier 12. As with the first switch feature 41, the second switch feature 61 may selectively switch between amplification modules 60-1, 60-2 of the array in dependence on the input envelope signal. The second switch feature 61 may be of any suitable type.

The second switch feature 61 and the first switch feature 41 may be controlled simultaneously, such that when the first switch 41 switches, so too does the second switch 61. In some examples, they may both be controlled in accordance with the output of the comparator described with reference to FIG. 4.

It will be appreciated that in circuits including the envelope amplification circuitry 11B of FIGS. 6 and 7, the inversion circuitry 13 depicted in FIGS. 1 to 3 may be omitted with the common terminal of the second switch feature 61 being connected to the gate of the RF transistor 120.

FIGS. 8 to 11 show various examples of the composition of the pre-processing block 10 shown in FIGS. 1 to 3. In each of the examples, the pre-processing block 10 may be configured to cause both the pre-input envelope signal and the input RF signal, which are output by the pre-processing block 10, to be pre-distorted thereby to account for non-linearities in the RF amplifier 12 and envelope signal amplification circuitry 11. This process may be referred to as "dual pre-distortion" and may further improve the performance, for example the efficiency, of the amplification circuitry 1 described with reference to FIGS. 1 to 7. The pre-processing block 10 may be further configured to utilise the feedback signal delivered via a feedback channel from the coupler 19 to update parameters associated with the pre-distortion in dependence on the amplified RF signal output by the RF amplifier 12.

Figure 8:
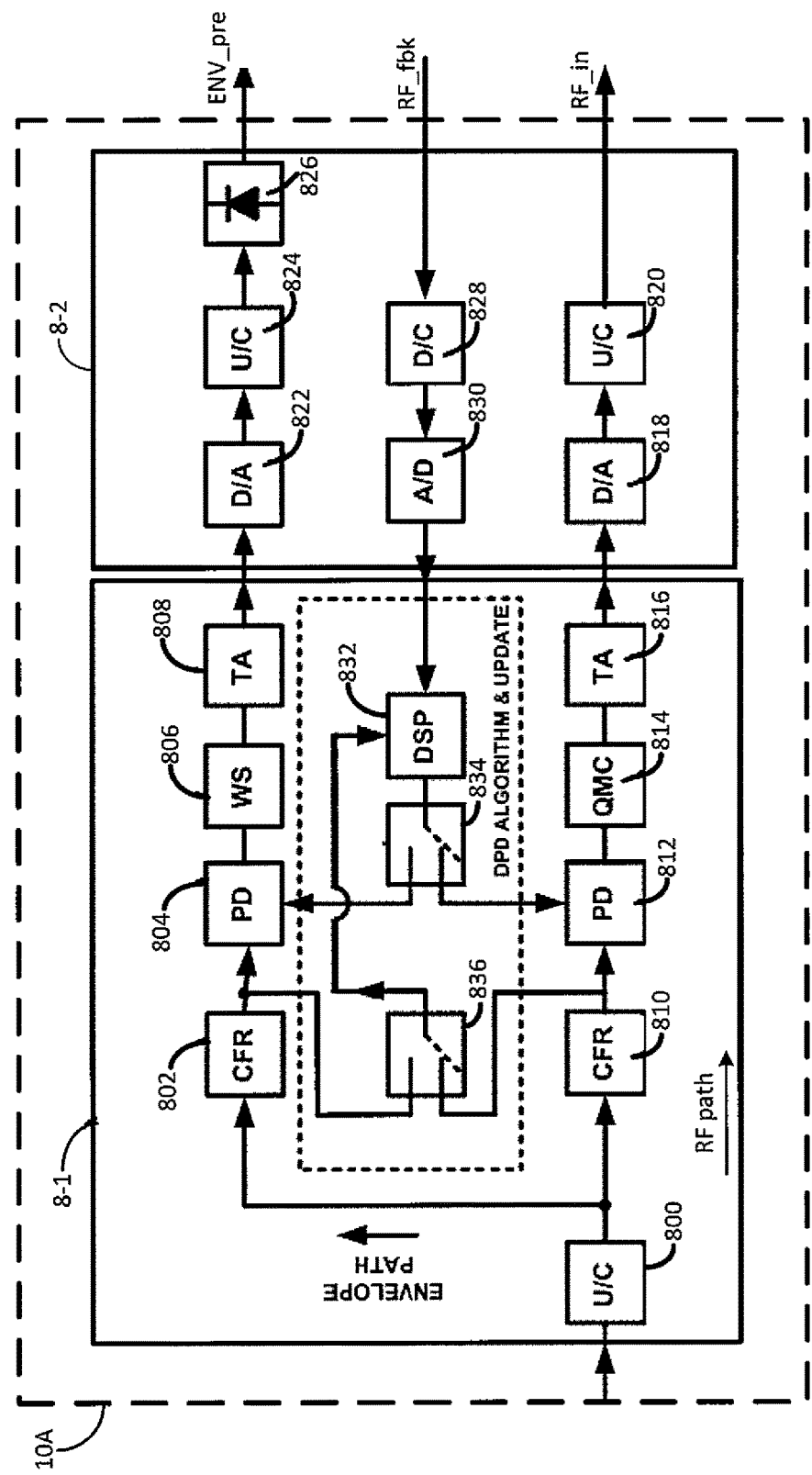
FIGS. 8 to 11 are alternative examples of the pre-processing block shown in the circuits of FIGS. 1 to 3.

In a first example shown in FIG. 8, the pre-processing block 10A comprises a digital block 8-1 and an analogue block 8-2. Operations performed by components in the digital block 8-2 take place in the digital domain, whereas operations performed by components in the analogue block 8-2 take place in the analogue domain.

The digital block 8-1 comprises a digital upconverter 800 (or digital upconversion module) configured to upconvert the incoming baseband I and Q data signals. The output of the digital upconverter 800 is passed along two separate paths: the envelope path and the RF path. The signal output at the end of the envelope path is the pre-input envelope signal and the signal output at the end of the RF path is the input RF signal.

Within the digital block 8-1, the envelope path includes an envelope crest factor reduction module 802 configured to apply crest factor reduction to the signal received from the digital upconverter 800. The output of the envelope crest factor reduction module 802 may be provided to a pre-distortion module 804 which may be configured to apply pre-distortion to the signal. Subsequently, the pre-distorted signal may be passed to a waveform shaping module 806 and then to a time alignment module 808 which are configured to apply waveform shaping and time alignment respectively to the pre-distorted signal. The output of the time alignment module 808 may be passed to the analogue block 8-2 and the operations performed therein are described below.

Within the digital block 8-1, the RF path includes an RF crest factor reduction module 810, configured to apply crest factor reduction to the signal received from the digital upconverter 800. The output of the crest factor reduction module 810 may be provided to a second pre-distortion module 812 which may be configured to apply pre-distortion to the signal. Subsequently, the pre-distorted signal may be passed to a quadrature error correction module 814 and then to a second time alignment module 816 which are configured to perform quadrature error correction and time alignment respectively to the pre-distorted signal. The output of the second time alignment module 816 may be passed to the analogue block 8-2 wherein it is converted to analogue by a first digital-to-analogue conversion module 818. Subsequent to digital-to-analogue conversion, the signal on the RF path is upconverted by a second upconverter 820. The output of the upconverter is the input RF signal which contributes towards the RF control signal passed to the RF power amplifier 12 (see FIGS. 1 to 3).

On the envelope path, the signal output by the first time aligner 808 is converted from digital to analogue by a second digital-to-analogue conversion module 822. Subsequently, the analogue signal may be passed to a third upconverter 824 for upconversion. After upconversion, the signal may be passed to an RF envelope detection module 826 which detects the envelope of the signal and outputs the pre-input envelope signal. The envelope detection may be performed in any suitable way, using, for example, a passive "diode detector" or an active mixer envelope detector Both the RF and envelope paths include pre-distortion and so, as will be understood, each of the signals resulting from those paths (i.e. the pre-input envelope signal and the input RF signal) include pre-distortion. This improves the performance of the circuit 1. The pre-distortion applied to each of the paths may be different. More specifically, the second pre-distortion module 812 may be configured to pre-distort the RF signal based on, for example, the non-linearities of the RF amplifier 12. The first pre-distortion module 804 may be configured to pre-distort the envelope pre-input signal based on, for example, the non-linearities in the comparator 16, the envelope signal amplification circuitry 11 and the RF amplifier 12.

As mentioned briefly above, the distortion parameters applied by the pre-distortion modules 804, 812 and on which the pre-distortion may be based, may be updated based on the RF feedback signal received via a feedback channel from the coupler 19. To this end the pre-processing block 8-2 may be configured to receive the RF feedback signal. More specifically, a downconverter 828 in the analogue block 8-2 may be configured to downconvert the received RF feedback signal. The downconverted signal may be then sent to an analogue to digital conversion module 830 after which the digital feedback signal is passed to the digital processing block 8-1.

In the digital processing block 8-1, the digital feedback signal may be received by a pre-distortion parameter determination module 832. The pre-distortion parameter determination module 832 may be configured to determine updated parameters for application by the pre-distortion modules 804, 812 based on at least the digital RF feedback signal. The pre-distortion parameter determination module 832 is coupled to the pre-distortion modules 804, 812 thereby to convey the updated parameters. More specifically, in the example of FIG. 8, the pre-distortion parameter determination module 832 is coupled to the pre-distortion modules 804, 812 by a first update switch. The first update switch may be configured to selectively couple the pre-distortion parameter determination module 832 to the pre-distortion modules 804, 812. The switch may be configured to couple the pre-distortion parameter determination module 832 with each of the pre-distortion modules in turn (or interleavedly). In this way, the parameters of each pre-distortion module 804, 812 may be alternately updated.

In addition, the digital pre-processing block 8-1 may comprise a second update switch which may be configured to alternately receive the outputs of the RF and envelope crest reduction factor modules 810, 802 and to pass these to the pre-distortion parameter determination module 832. The pre-distortion parameter determination module 832 may, thus, be configured to determine the updated pre-distortion parameters based on pre-processing envelope and RF signals.

Pre-distortion techniques and techniques for updating pre-distortion parameters are known in the art (for example, involving digital pre-distortion lookup table circuits (LUT) or memory polynomial (MP) circuits) and so are not described in more detail herein.

Figure 9:
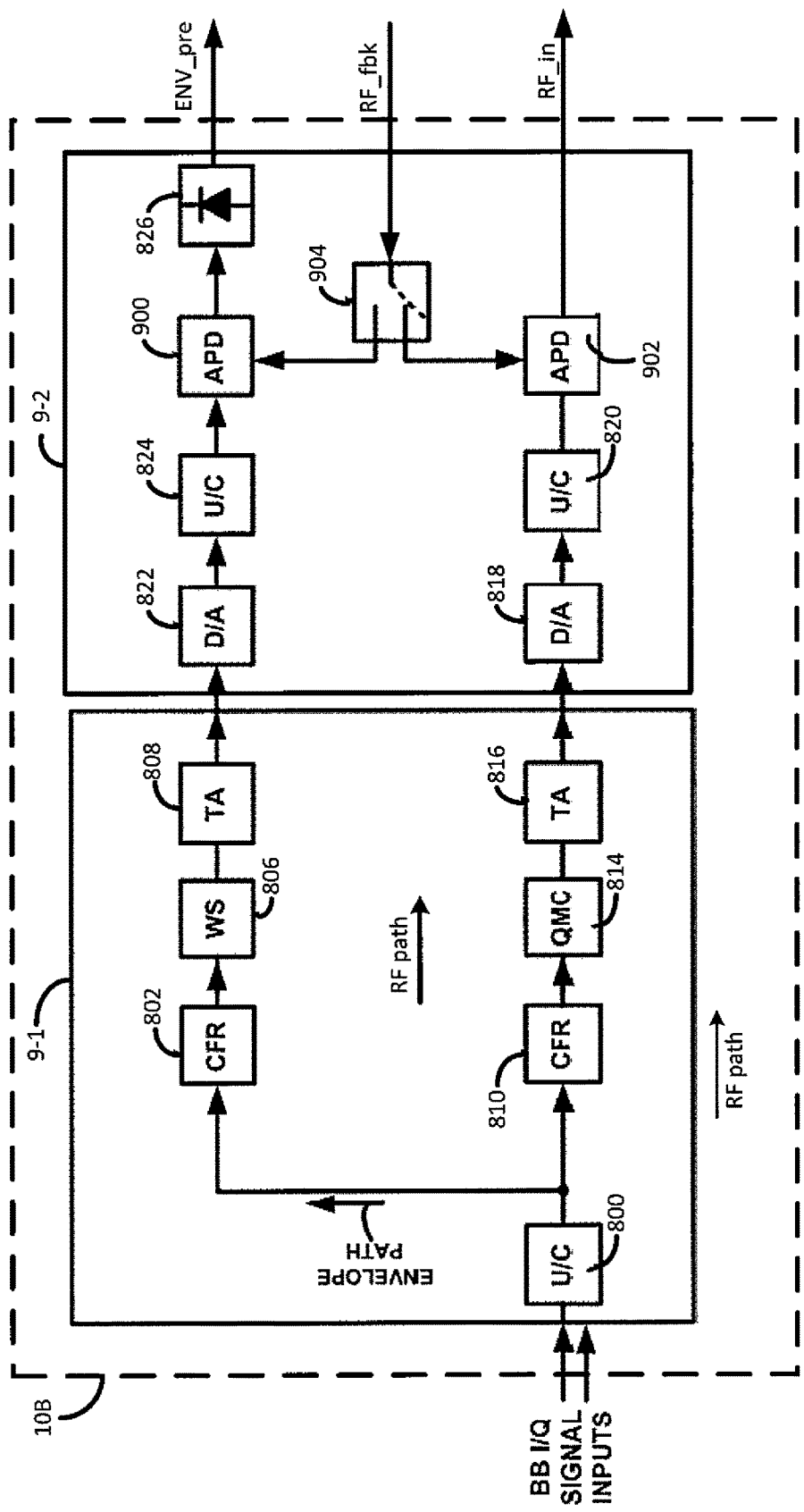

FIG. 9 shows an alternative example of a pre-processing block 10B which may form part of circuits described with reference to FIGS. 1 to 7. The pre-processing block 10B of FIG. 9 may be substantially the same that of FIG. 8 and, as such, only the differences will be described. The main difference is that the block 10B includes first and second analogue pre-distortion modules 900, 902 in the analogue block 9-2. Put another way, pre-distortion of the RF and envelope signals is carried out in the analogue domain. The analogue pre-distortion modules 900, 902 replace the first and second pre-distortion modules 804, 812 which are not present in the digital processing block 9-1 of FIG. 9. The first analogue pre-distortion module 900 is provided in the envelope path between the third upconverter 824 and the RF envelope detection module 826. The second analogue pre-distortion module 902 is placed in the RF path after the second upconverter 820. In this example, the second analogue pre-distortion module 902 is configured to the output the input RF signal.

The other difference between the examples of FIGS. 8 and 9 is that the first and second update switches 834, 836 and the pre-distortion parameter determination module 832 are removed. These are replaced by a single update switch 904 located in the analogue block 9-2, which is configured to alternately convey the RF feedback signal to the analogue pre-distortion modules 900, 902. In this example, the analogue pre-distortion modules 900, 902 are configured to determine the updated pre-distortion parameters based on the RF feedback signal and, optionally, also the analogue pre-processing signals received from the second and third upconverters 824, 820 respectively.

Figure 10:
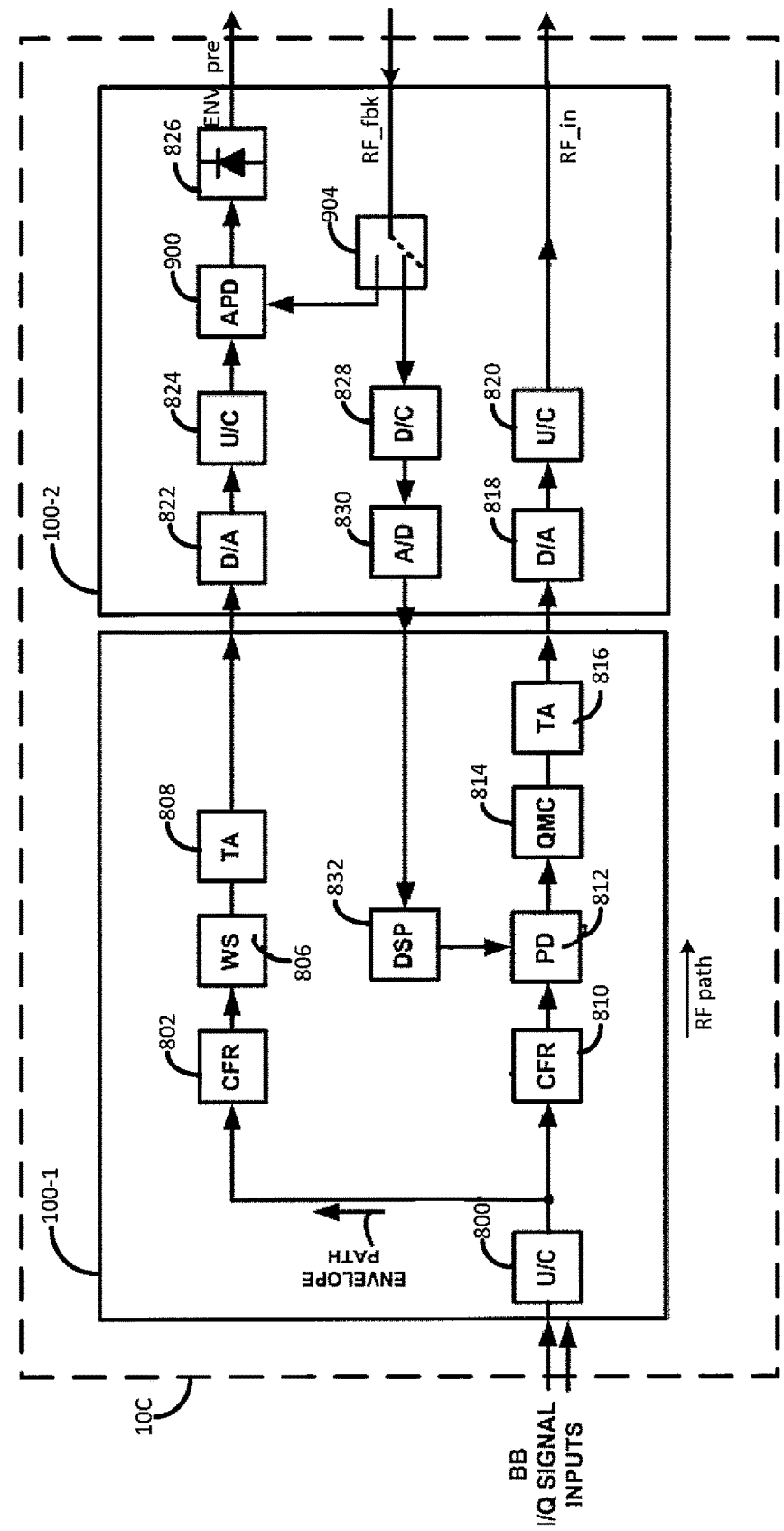

FIG. 10 shows an example of another pre-processing block 10C. As with the example of FIG. 9, the pre-processing block 10C of FIG. 10 will be described by way of its differences when compared to the pre-processing block 10A depicted in FIG. 10.

The main difference is that the block 10C may include a first analogue pre-distortion module 900 in the analogue block 100-2. The first analogue pre-distortion module 900 may be provided in the envelope path such that pre-distortion of the envelope signal is carried out in the analogue domain. The first analogue pre-distortion module 900 may replace the first pre-distortion module 804 which is not present in the digital processing block 100-1 of FIG. 10. Unlike in example of FIG. 9, however, pre-distortion may be applied to the RF signal in the digital domain. The first analogue pre-distortion module 900 may be provided in the envelope path between the third upconverter 824 and the RF envelope detection module 826.

The other difference between the examples of FIGS. 8 and 10 is that the first and second update switches 834, 836 may be removed. These may be replaced by a single update switch 904 located in the analogue block 9-2, which may be configured to alternately convey the RF feedback signal to the first analogue pre-distortion module 900 for pre-distorting the envelope signal and to the downconversion module 828. The downconverted feedback signal may be then passed to the analogue to digital converter 830 and subsequently to the pre-distortion parameter determination module 832, which may be configured to determine and provide updated parameters to the digital pre-distorter for pre-distorting the RF signal. As in the example of FIG. 9, the first analogue pre-distortion module 900 may be configured to determine the updated pre-distortion parameters based on the RF feedback signal and, optionally, also the analogue pre-processing signal received from the third upconverter 824.

Figure 11:
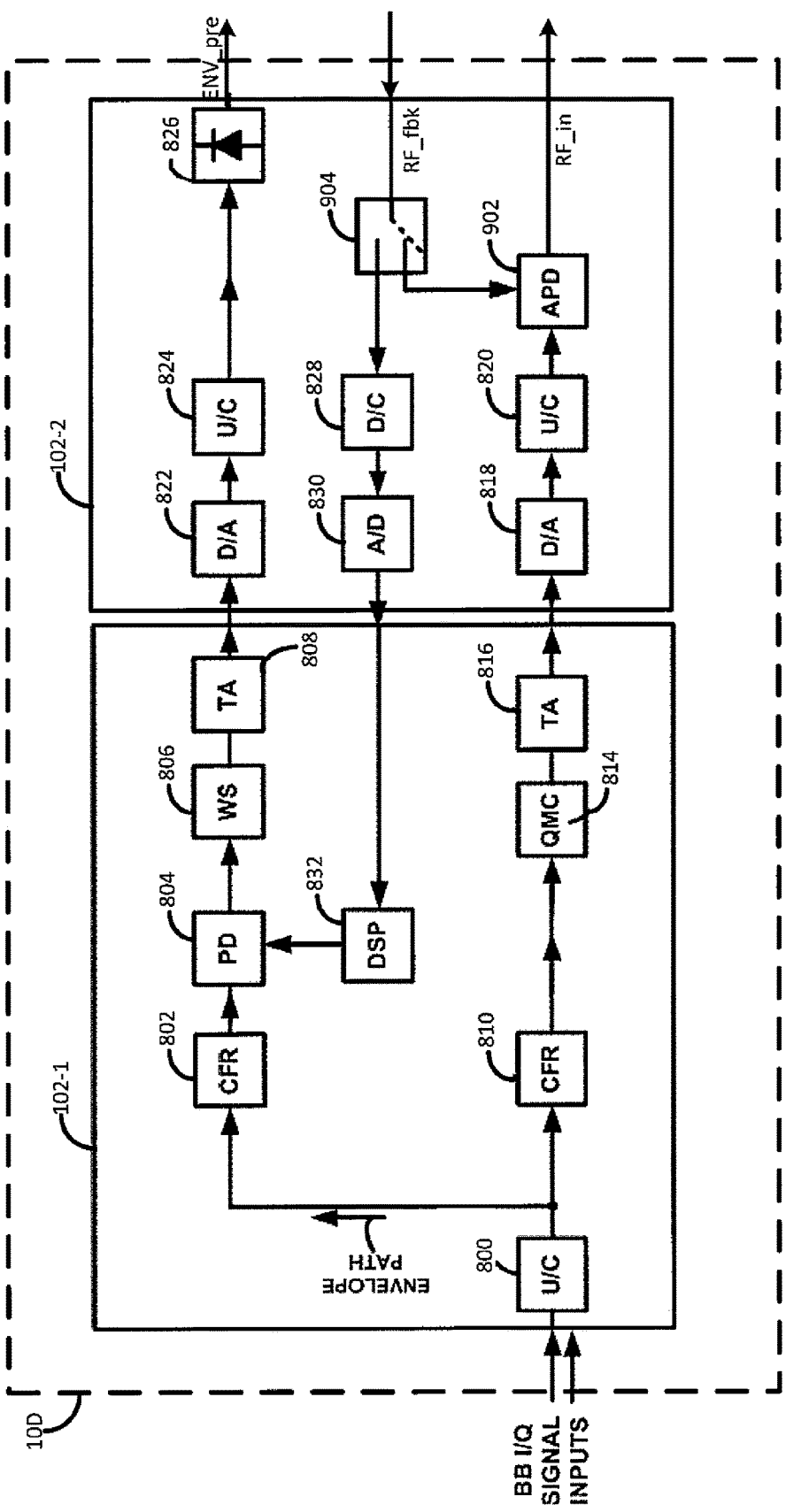

FIG. 11 shows another example of a pre-processing block 10D which may form part of the circuit described with reference to FIGS. 1 to 7. This example may be similar to that of FIG. 10 except that pre-distortion of the RF signal may be performed in the analogue domain, whereas pre-distortion of the envelope signal may be performed in the digital domain. As such, in this example, the single update switch 904 may be configured to alternately convey the RF feedback signal to the second analogue pre-distortion module 902 for pre-distorting the RF signal and to the downconversion module 828. The pre-distortion parameter determination module 832 may be configured to determine and provide updated parameters to the digital pre-distorter for pre-distorting the envelope signal.

It will of course be appreciated that the pre-processing blocks of FIGS. 8 to 11 are examples only and that pre-distortion and the other operations performed by the pre-processing blocks 10A to 10D may be performed differently, such as in a different order. In addition, the functional modules etc depicted in the Figures are examples only and the functions need not be performed by discrete modules. As such, the functionality of more than one module may be integrated into a particular sub-circuit or processing block.

Figure 12:
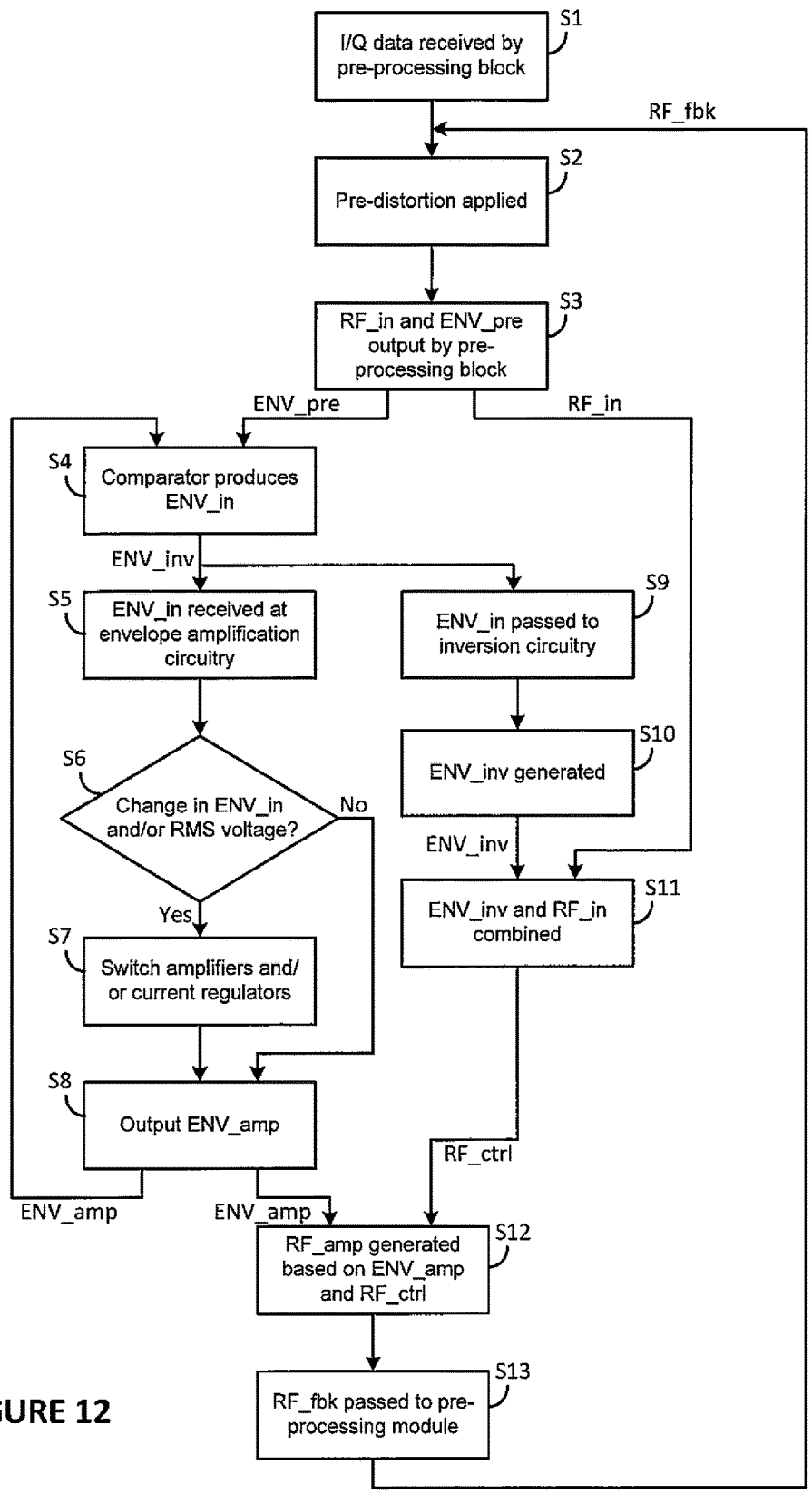
FIG. 12 is a flow chart illustrating operations which may be performed by circuits such as those described with reference to FIGS. 1 to 8.

FIG. 12 is a flow chart illustrating various aspects, functions and signal paths of the circuits described herein. The flow chart is an example only and is not intended to be limiting. Indeed, it will be appreciated that the operations performed by the circuits described herein may be in a different order to that shown and that many of the operations may be performed concurrently. In addition in various circuits described herein, certain operations shown in FIG. 12 may be omitted.

In operation S1, the pre-processing block 10 receives the I and Q data signals.

In operation S2, the pre-processing block 10 causes pre-distortion to be applied to both the pre-input envelope signal and the input RF signal.

In operation S3, the pre-processing block 10 outputs the pre-input envelope signal and the input RF signal.

The pre-input envelope signal is then received at the comparator 16 which, in operation S4, produces the input envelope signal based on the pre-input envelope signal and the amplified envelope signal, which is output in operation S8 by the envelope amplification circuitry 11.

Next, in operation S5, the input envelope signal is received at the envelope amplification circuitry 11. The input envelope signal is also, in operation S9, received from the comparator 16 at the inversion circuitry 13.

Subsequent to operation S5, in operation S6, it may be determined whether there has been a change in the input envelope signal which causes it to pass a threshold and/or to have a different RMS power for which a different current level is more suitable.

In response to a positive determination, in operation S7, the switch feature 41 switches to route the input envelope signal to a different amplification module 40. In addition, or alternatively, operation S7 may comprise a different one, or combination, of the constant current regulators 51 within the presently-connected amplification modules 40 being connected in parallel with the transistor 50 of the connected amplification module. The switching operation may be performed in any suitable way, for example as described with reference to FIGS. 4 to 7.

Subsequently, in operation S8, the amplified envelope signal is output from the envelope amplification circuitry 11. This is returned for use by the comparator 16 in operation S4. It is also passed to the RF power amplifier 12 for use in operation S12.

Following receipt of the input envelope signal at the inversion circuitry 13 (see operation S9), in operation SM, the inverted envelope signal is generated by the inversion circuitry 13.

Subsequently, in operation S11, the inverted envelope signal and the input RF signals are combined and the RF control signal is formed.

In operation S12, the amplified envelope signal and the RF control signal are used by the RF power amplifier 12 to generate the amplified radio frequency signal. This may be suitable for driving an antenna of a communications device.

Finally in operation S13, the RF feedback signal may be passed back via the feedback channel to the pre-processing block 10 for use in the pre-distortion of operation S2.

It should be realized that the foregoing embodiments should not be construed as limiting. Other variations and modifications will be apparent to persons skilled in the art upon reading the present application. For example, in the Figures particular types of transistor (N channel IGFETs) have been depicted, but it will be appreciated that other types of transistor may instead be used. In addition, although "ground" has been depicted in and described in reference to the circuits described herein, it will be appreciated that the circuits may, in fact, not be grounded and that the "ground" may instead represent a low voltage level. Moreover, the disclosure of the present application should be understood to include any novel features or any novel combination of features either explicitly or implicitly disclosed herein or any generalization thereof and during the prosecution of the present application or of any application derived therefrom, new claims may be formulated to cover any such features and/or combination of such features.

As used in this application, the term 'circuitry' may refer to all of the following: (a) hardware-only circuit implementations (such as implementations in only analogue and/or digital circuitry); (b) to combinations of circuits and software (and/or firmware), such as (as applicable): (i) to a combination of processor(s) or (ii) to portions of processor(s)/software (including digital signal processor(s)), software, and memory(ies) that work together to cause an apparatus, such as a mobile phone or server, to perform various functions); and (c) to circuits, such as a microprocessor(s) or a portion of a microprocessor(s), that require software or firmware for operation, even if the software or firmware is not physically present.

This definition of 'circuitry' applies to all uses of this term in this application, including in any claims. As a further example, as used in this application, the term "circuitry" would also cover an implementation of merely a processor (or multiple processors) or portion of a processor and its (or their) accompanying software and/or firmware. The term "circuitry" would also cover, for example and if applicable to the particular claim element, a baseband integrated circuit or applications processor integrated circuit for a mobile phone or a similar integrated circuit in server, a cellular network device, or other network device.

The "modules" described herein may include "circuitry" as described in the above two paragraphs.

What is claimed is:

1. Apparatus comprising:
envelope signal amplification circuitry configured to receive an input envelope signal indicative of an envelope of an input radio frequency signal and to output an amplified envelope signal;
inversion circuitry configured to invert the input envelope signal; and
a radio frequency power amplifier configured to receive a radio frequency control signal which is dependent on the input radio frequency signal and the inverted input envelope signal and, using the amplified envelope signal as its supply voltage, to output an amplified radio frequency signal.

2. The apparatus of claim 1, the inversion circuitry comprising an inverter amplifier configured actively to invert the input envelope signal.

3. The apparatus of claim 1, the inversion circuitry comprising a transformer configured passively to invert the input envelope signal.

4. The apparatus of claim 3, wherein the primary winding of the transformer is configured to receive the input envelope signal, and wherein the primary winding and the secondary winding are oppositely configured.

5. The apparatus of claim 1, wherein the envelope signal amplification circuitry comprises a transistor, the input envelope signal being provided to the gate/base of the transistor.

6. The apparatus of claim 1, comprising a comparator configured to receive a pre-input envelope signal and the amplified envelope signal and to output the input envelope signal.

7. The apparatus of claim 1, the envelope signal amplification circuitry comprising a plurality of envelope signal amplification modules, the input envelope signal being selectively provided to one of the plurality of envelope signal amplification modules in dependence on a first property associated with the input envelope signal.

8. The apparatus of claim 7, wherein each envelope signal amplification module is provided with a voltage supply having a different magnitude.

9. The apparatus of claim 7, each of the envelope signal amplification modules having an associated current regulator array.

10. The apparatus of claim 9, wherein at least one of the current regulators in each array is individually connectable in dependence on a second property associated with the input envelope signal.

11. The apparatus of claim 9, wherein each current regulator in the array has different constant current level.

12. The apparatus of claim 7, each of the envelope signal amplification modules having associated inversion circuitry configured to invert the input envelope signal.

13. The apparatus of claim 1, wherein each of the input envelope signal and the input radio frequency signal is pre-distorted.

14. The apparatus of claim 13, comprising:
an envelope signal pre-distorter configured to cause the input envelope signal to be pre-distorted; and
an input radio frequency signal pre-distorter configured to cause the input radio frequency signal to be pre-distorted.

15. The apparatus of claim 14, comprising:
a feedback channel configured to deliver a feedback signal indicative of the amplified radio frequency signal or a signal derived from the feedback signal to the envelope signal pre-distorter and/or the input radio frequency signal pre-distorter, the envelope signal pre-distorter and/or the input radio frequency signal pre-distorter being configured to adapt its pre-distortion based on the feedback signal or the derived signal.

16. The apparatus of claim 15, wherein the feedback channel comprises a switch feature configured to switch the Channel between delivery of the feedback signal or the signal derived from the feedback signal to the envelope signal pre-distorter and delivery of the feedback signal or the signal derived from the feedback signal to the input radio frequency signal pre-distorter.

17. The apparatus of claim 14, wherein:
the envelope signal pre-distorter and the input radio frequency signal pre-distorter are both digital pre-distorters or both analogue pre-distorters; or
one of the envelope signal pre-distorter and the input radio frequency signal pre-distorter is an analogue pre-distorter and the other is a digital pre-distorter.

18. Apparatus comprising:
envelope signal amplification circuitry configured to receive an input envelope signal indicative of an envelope of an input radio frequency signal and to output an amplified envelope signal; and
a radio frequency power amplifier configured to receive a radio frequency control signal and, using the amplified envelope signal received from the envelope signal amplification circuitry as its supply voltage, to output an amplified radio frequency signal, wherein each of the input envelope signal and the input radio frequency signal is pre-distorted.

19. Apparatus comprising:
a plurality of envelope signal amplification modules each configured to receive an input envelope signal indicative of an envelope of a input radio frequency signal and to output an amplified envelope signal;
a radio frequency power amplifier configured to receive a radio frequency control signal and, using the amplified envelope signal received from one of the plurality of envelope signal amplification modules as its supply voltage, to output an amplified radio frequency signal; and
a switch feature configured to select one of the plurality of envelope signal amplification modules to receive the input envelope signal based on a property associated with the input envelope signal.

* * * * *